(12) United States Patent
Solheid et al.

(10) Patent No.: US 7,922,269 B2
(45) Date of Patent: Apr. 12, 2011

(54) CABINET ASSEMBLY INCLUDING A SCISSORS LIFT

(75) Inventors: James J. Solheid, Lakeville, MN (US); Matthew Holmberg, Le Center, MN (US); Trevor D. Smith, Eden Prairie, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 347 days.

(21) Appl. No.: 11/975,363

(22) Filed: Oct. 17, 2007

(65) Prior Publication Data

US 2008/0211364 A1 Sep. 4, 2008

Related U.S. Application Data

(60) Provisional application No. 60/852,450, filed on Oct. 17, 2006.

(51) Int. Cl.
*A47B 67/02* (2006.01)

(52) U.S. Cl. ...................................................... 312/247

(58) Field of Classification Search .................. 248/320, 248/323, 324; 108/147, 147.11, 118, 145; 312/247, 312, 249.1, 319.5, 319.7, 306, 351.6, 312/351.8; 182/69.5; 174/45 R
See application file for complete search history.

(56) References Cited

U.S. PATENT DOCUMENTS

| | | | | |
|---|---|---|---|---|
| 39,857 A | * | 9/1863 | Wollison | 182/148 |
| 495,546 A | * | 4/1893 | Ebert | 4/479 |
| 1,215,261 A | * | 2/1917 | Dyke | 211/75 |
| 2,462,626 A | * | 2/1949 | Forster | 182/157 |
| 2,968,520 A | * | 1/1961 | Abrens | 312/246 |
| 3,278,247 A | * | 10/1966 | Tisdell | 312/209 |
| 4,371,222 A | * | 2/1983 | Gorkiewicz | 312/211 |
| 4,541,209 A | | 9/1985 | Hoag | |
| 4,546,852 A | * | 10/1985 | Martin et al. | 182/12 |
| 4,749,169 A | * | 6/1988 | Pickles | 254/122 |
| 4,752,110 A | | 6/1988 | Blanchet | |
| 4,812,004 A | | 3/1989 | Biederstedt | |
| 4,827,646 A | * | 5/1989 | Miller et al. | 40/591 |
| 4,884,863 A | | 12/1989 | Throckmorton | |
| 5,024,498 A | | 6/1991 | Becker | |
| 5,069,516 A | | 12/1991 | Kohy et al. | |

(Continued)

FOREIGN PATENT DOCUMENTS

DE 41 40 701 C1 12/1992

(Continued)

OTHER PUBLICATIONS

ADC Telecommunications, Inc., "Outside Plant FiberSeal® Terminal Enclosure Below Ground Application Installation Guide," ADCP-93-019, 1st Edition, Issue 4, pp. i-iv, 1-20 (Oct. 1997).

(Continued)

*Primary Examiner* — Janet M Wilkens
*Assistant Examiner* — Matthew W Ing
(74) *Attorney, Agent, or Firm* — Merchant & Gould P.C.

(57) ABSTRACT

A cabinet assembly is disclosed. The cabinet assembly includes a scissors lift mountable to a utility pole and including a plurality of linkages. The scissors lift is moveable between extended and retracted positions. The scissors lift includes a drive mechanism interfaced with the linkages and configured to move the scissors lift between the extended and retracted positions. The cabinet assembly further includes a cabinet mounted to the scissors lift and moveable between raised and lowered positions.

18 Claims, 6 Drawing Sheets

U.S. PATENT DOCUMENTS

| | | | |
|---|---|---|---|
| 5,109,467 A | 4/1992 | Hogan | |
| 5,133,038 A | 7/1992 | Zipper | |
| 5,189,723 A | 2/1993 | Johnson et al. | |
| 5,426,577 A * | 6/1995 | Gordin et al. | 362/431 |
| 5,548,678 A | 8/1996 | Frost et al. | |
| 5,588,076 A | 12/1996 | Peacock et al. | |
| 5,706,384 A | 1/1998 | Peacock et al. | |
| 5,939,669 A | 8/1999 | Finzel et al. | |
| 6,028,769 A | 2/2000 | Zurek | |
| 6,031,180 A | 2/2000 | Schilling et al. | |
| 6,181,861 B1 | 1/2001 | Wenski et al. | |
| 6,185,303 B1 * | 2/2001 | Losey | 379/454 |
| 6,312,067 B1 * | 11/2001 | Blanchard et al. | 312/102 |
| 6,316,728 B1 | 11/2001 | Hoover et al. | |
| 6,983,095 B2 | 1/2006 | Reagan et al. | |
| 7,038,127 B2 | 5/2006 | Harwood | |
| 7,190,874 B1 | 3/2007 | Barth et al. | |
| 7,260,301 B2 | 8/2007 | Barth et al. | |
| 7,327,926 B2 | 2/2008 | Barth et al. | |
| 7,330,625 B2 | 2/2008 | Barth | |
| 7,333,320 B2 | 2/2008 | Standish et al. | |
| 7,633,742 B2 | 12/2009 | Standish et al. | |
| 2004/0063076 A1 | 4/2004 | Van Leest | |
| 2005/0247136 A1 | 11/2005 | Cross et al. | |
| 2006/0269204 A1 | 11/2006 | Barth et al. | |
| 2006/0278426 A1 | 12/2006 | Barth | |
| 2007/0284980 A1 * | 12/2007 | Peters et al. | 312/317.3 |

FOREIGN PATENT DOCUMENTS

| | | |
|---|---|---|
| EP | 0 840 420 | 5/1998 |

OTHER PUBLICATIONS

ADC Telecommunications, Inc., "Fiber Outside Plant Systems," 1040 Aug. 1998 Revision © 1997, 1998, 12 Pages.

ADC Telecommunications, Inc., "FiberSeal® Outside Plant System," 1031, Jun. 1998 Revision © 1995, 1997, 1998, 12 Pages.

* cited by examiner

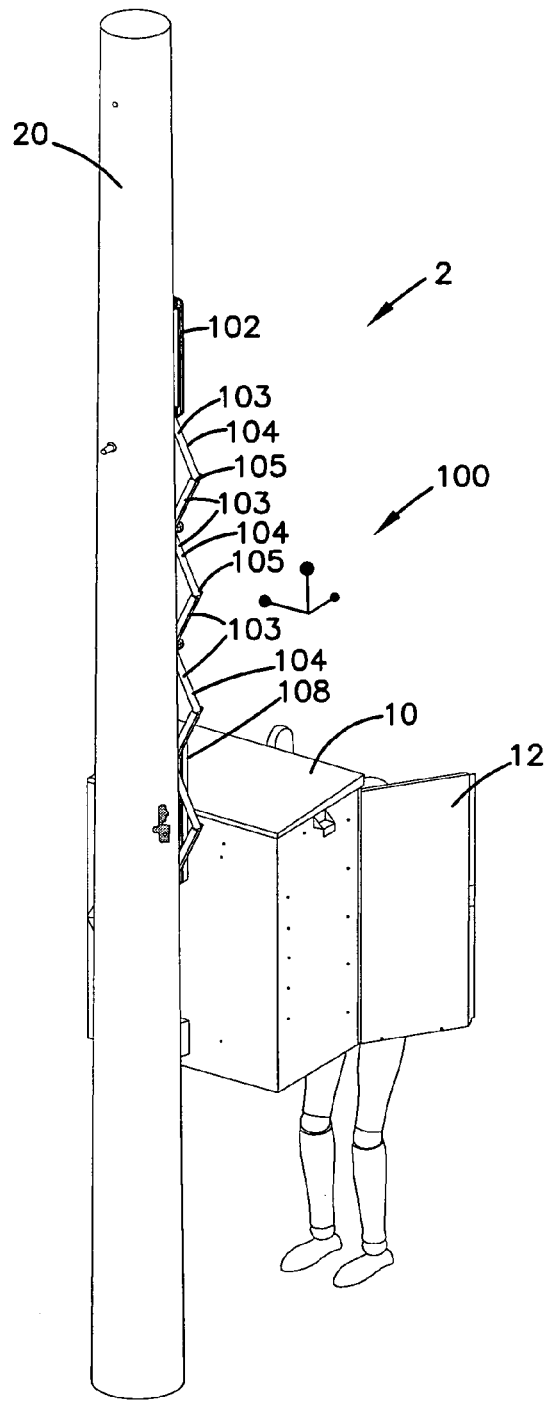
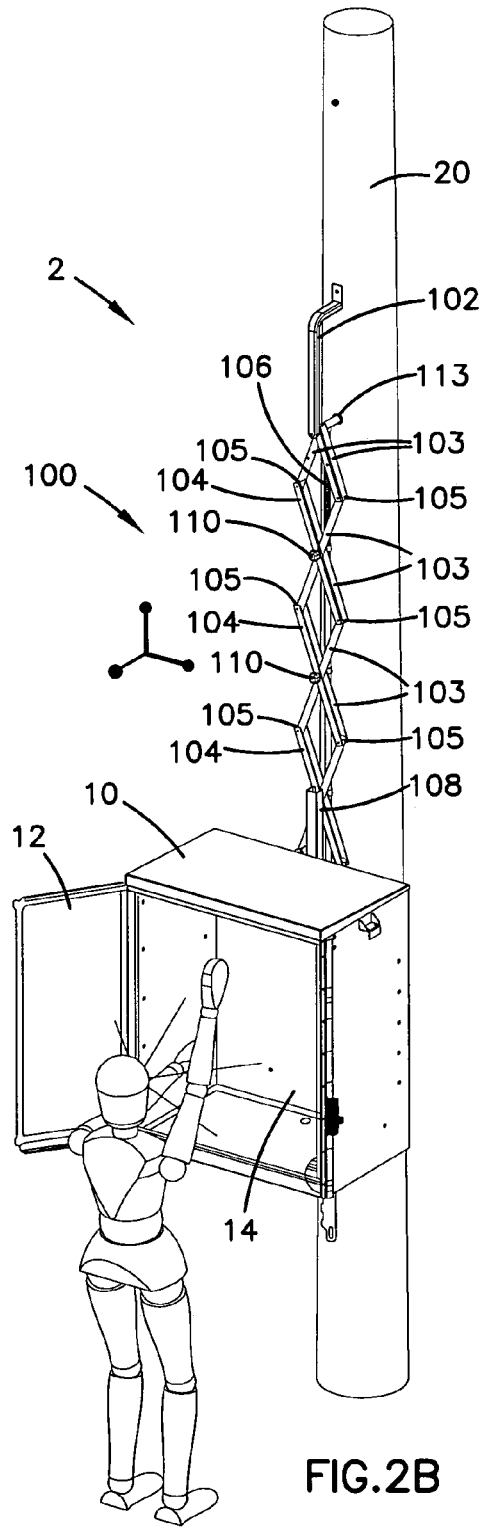
FIG.2A
FIG.2B

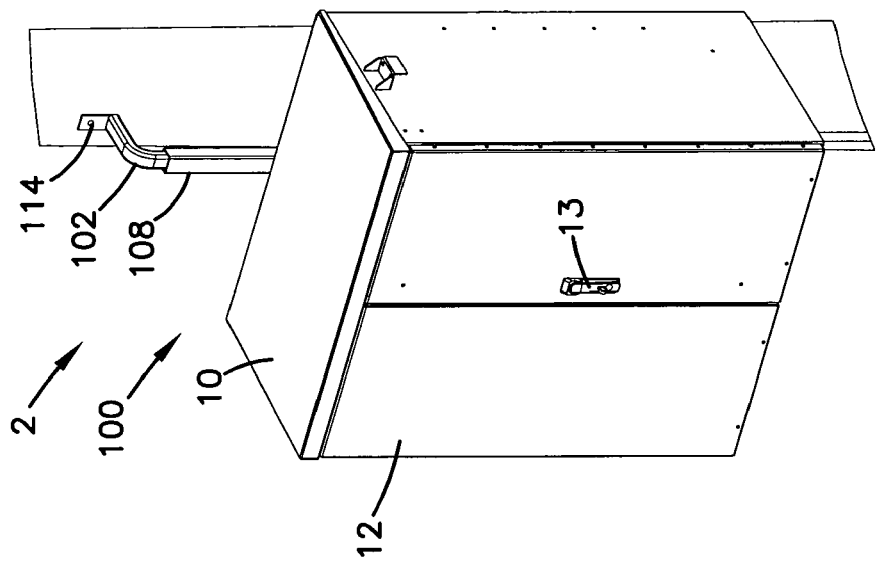
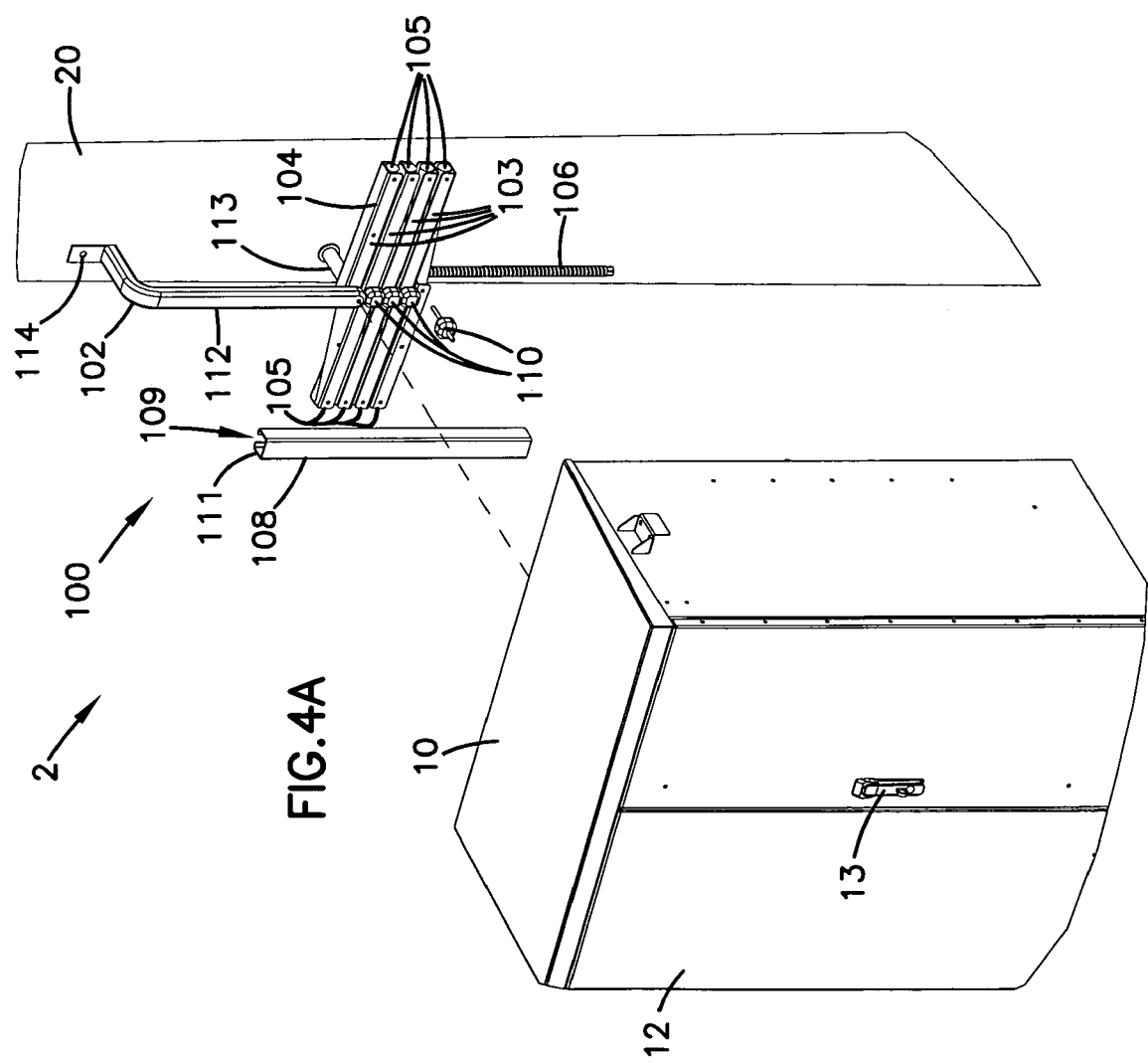

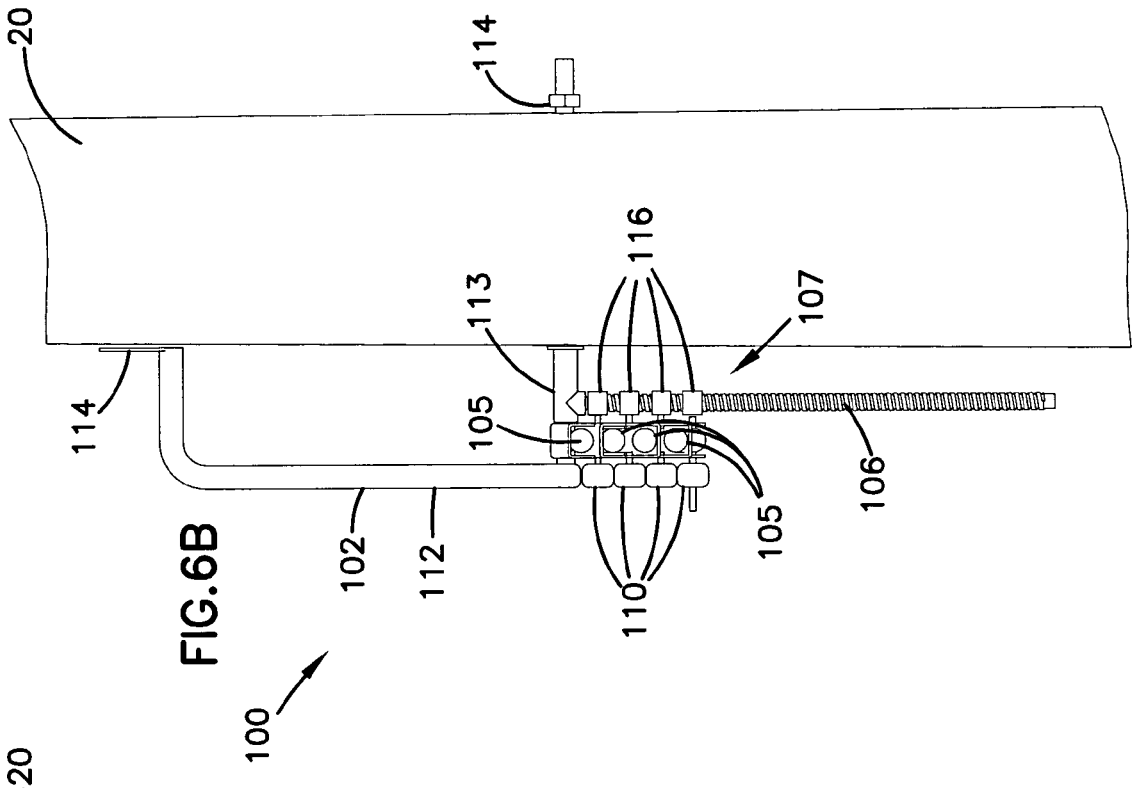
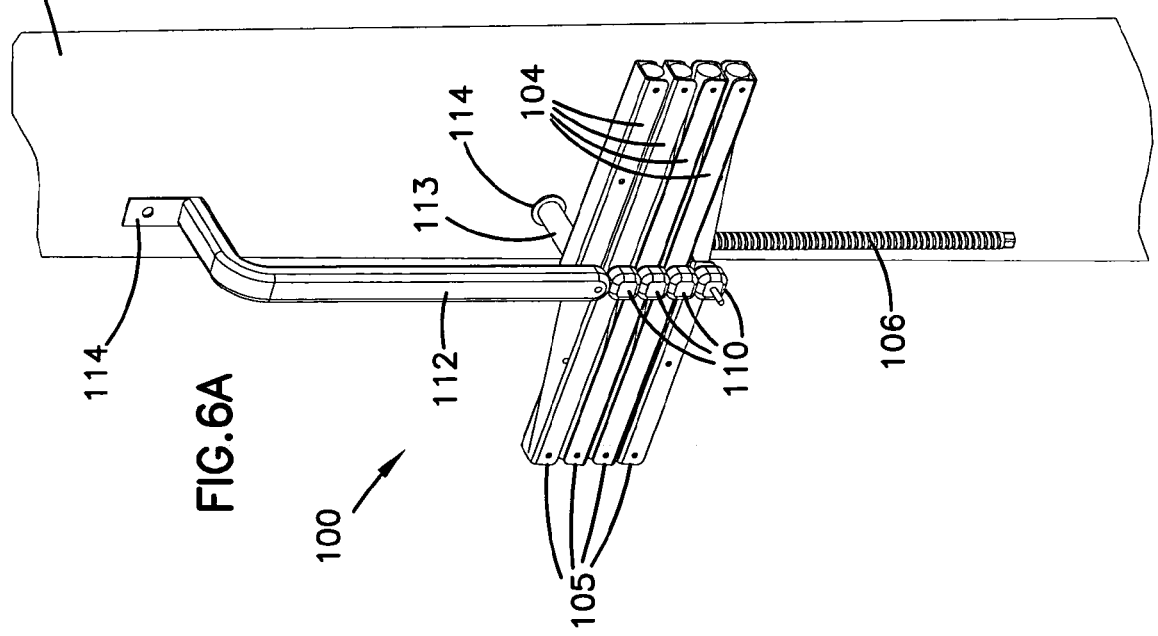

CABINET ASSEMBLY INCLUDING A SCISSORS LIFT

CROSS-REFERENCE TO RELATED APPLICATIONS

This application claims the benefit of U.S. Provisional Application Ser. No. 60/852,450, filed Oct. 17, 2006; which application is incorporated herein by reference in its entirety.

TECHNICAL FIELD

The present invention relates to a scissors lift. More specifically, the present invention relates to a cabinet assembly including a scissors lift.

BACKGROUND

Various electronic and telecommunications devices are contained in cabinets or enclosures mounted to utility poles. These cabinets can include telecommunication control devices and routing paths for telecommunications wires. One example of such a cabinet is a fiber distribution hub (FDH). Fiber distribution hubs provide an enclosure for fiber optic routing equipment, such as splices and other equipment.

The cabinets are generally mounted to utility poles at an elevated location out of reach or view from a human. Installation of cabinets at such heights avoids clearance, vandalism, or right of way issues which may otherwise occur.

Repairpersons periodically view and access the interior of the cabinet for maintenance, repair, or reconfiguration of equipment stored therein. Such maintenance generally requires use of a lift truck, ladder or some other method of raising the repairperson to the height and location of the cabinet. Requiring use of lift trucks adds expense to the maintenance and repair costs for the telecommunications network. Furthermore, lift trucks and ladders have stability limitations which are not experienced by repairpersons standing on the ground.

Therefore, improvements are desirable.

SUMMARY

The embodiments of the present disclosure provide a scissors lift for a cabinet assembly. In one aspect, a scissors lift is disclosed. The scissors lift is mountable to a utility pole and includes a plurality of linkages. The scissors lift is moveable between extended and retracted positions. The scissors lift also includes a drive mechanism for moving the linkages at the desired time to raise and lower equipment mounted to the linkages by moving the scissors lift between the extended and retracted positions. The cabinet assembly further includes a cabinet mounted to the scissors lift and moveable between raised and lowered positions.

According to another aspect, a telecommunications cabinet assembly is disclosed. The telecommunications cabinet assembly includes a scissors lift fastened to a utility pole at a raised position. The scissors lift includes a plurality of linkages and a drive mechanism, and is oriented downwardly and moveable between extended and retracted positions. The telecommunications cabinet assembly also includes a telecommunications cabinet mounted to the scissors lift and moveable between the raised position and a lowered position by extending the scissors lift from the retracted position to the extended position.

According to a further aspect, a method of accessing a telecommunications cabinet is disclosed. The method includes extending a scissors lift to move a telecommunications cabinet from a raised position to a lowered position. The method also includes accessing the interior of the telecommunications cabinet. The method further includes retracting the scissors lift to move the telecommunications cabinet from the lowered position to the raised position.

According to a still further aspect, a scissors lift for a telecommunications cabinet is disclosed. The scissors lift includes a mount mountable to a utility pole and a plurality of scissors linkages. The scissors lift further includes a drive mechanism interfaced with the plurality of scissors linkages and configured to move the linkages between extended and retracted positions, wherein the drive mechanism includes a screw drive and a plurality of support bands affixed to the plurality of scissors linkages. In this aspect, one of the support bands includes a threaded interior configured to interlock with the screw drive.

BRIEF DESCRIPTION OF THE DRAWINGS

FIG. 2A is a schematic perspective rear view of the cabinet assembly of FIG. 1 in a lowered position and mounted to a utility pole;

FIG. 2B is a schematic perspective front view of the cabinet assembly of FIG. 1 in a lowered position and mounted to a utility pole;

FIG. 4A is an exploded view of the cabinet assembly of FIG. 1 mounted to a utility pole;

FIG. 4B is a perspective view of the cabinet assembly of FIG. 1 mounted to a utility pole;

FIG. 6A is a perspective view of a portion of a utility pole having a scissors lift mounted thereon; and FIG. 6B is a side view of the utility pole and scissors lift of FIG. 6A.

DETAILED DESCRIPTION

Figure 1:
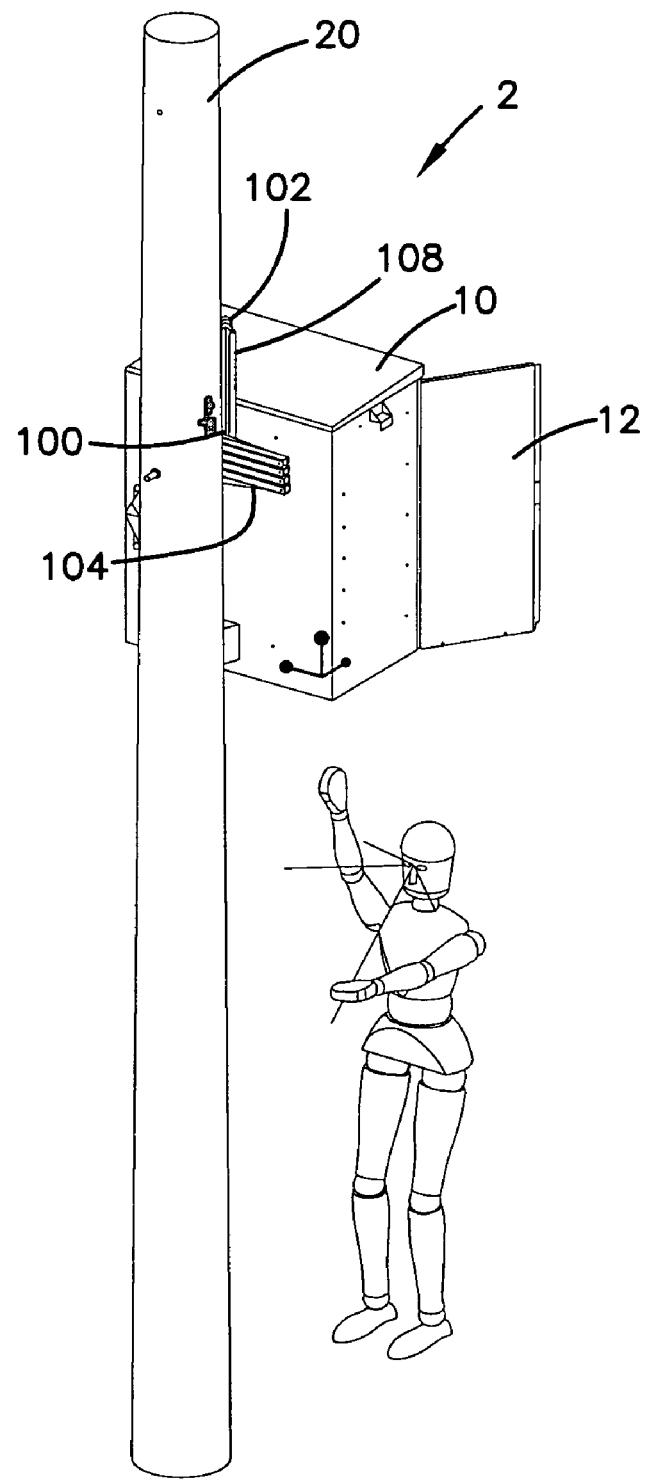
FIG. 1 is a schematic perspective rear view of a cabinet assembly in a raised position mounted to a utility pole.

Various embodiments of the present disclosure will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general, the present disclosure relates to a cabinet assembly mountable to a utility pole. The cabinet assembly includes a cabinet and a scissors lift. The scissors lift is driven by a drive mechanism between a retracted position and an extended position so as to move the cabinet between raised and lowered positions, respectively.

Referring now to FIG. 1, a cabinet assembly 2 is shown mounted to a utility pole 20. The cabinet assembly 2 includes a cabinet 10 and a scissors lift 100. The cabinet 10 is configured to include telecommunications equipment. In a possible embodiment, the cabinet 10 is a fiber distribution hub in which a fiber optic distribution cable is separated by splices into a number of fiber ribbons which in turn are routed out of the fiber distribution hub. An example of such a cabinet is shown and described in U.S. Pat. No. 6,983,095, entitled "Systems and Methods for Managing Optical Fibers and Components Within an Enclosure in an Optical Network" and assigned to Fiber Optic Network Solutions Corp., the disclosure of which is hereby incorporated by reference in its entirety. In further embodiments, a variety of other types of telecommunications equipment may be stored in the cabinet.

The cabinet 10 as shown is generally rectangular, having front and rear faces and side panels. The cabinet has doors 12 configured to swing open and closed from hinges located along front vertical edges. In the embodiment shown in FIG. 1, the doors 12 are in an open position. Other sizes and configurations of the cabinet are possible as well.

The cabinet 10 is mounted to the utility pole 20 such that the cabinet 10 generally resides at a raised position when the scissors lift 100 is retracted, preferably at a height not easily reachable by a human. In a possible embodiment, the cabinet resides at a raised position eight or more feet off the ground.

The scissors lift 100 is oriented and extendable downwardly, and provides an adjustable mount by which the cabinet 10 mounts to a utility pole 20. The scissors lift 100 includes a mounting arrangement 102, a plurality of linkages 104, and a drive mechanism 107 (shown most clearly in FIGS. 6A-6B, below) configured to raise and lower the cabinet along the utility pole 20, as described below. In the embodiment shown, when the cabinet 10 is in a raised position shown in FIG. 1, the scissors lift 100 is in a retracted position. Conversely, when the cabinet 10 is in a lowered position as shown below in FIGS. 2A-2B and FIG. 3, the scissors lift 100 is in an extended position. Other embodiments are possible as well, such as an embodiment in which the scissors lift 100 is in an extended position when the cabinet 10 is in a raised position and the scissors lift is moved to a retracted position when the cabinet is in a lowered position.

The mounting arrangement 102 affixes the scissors lift 100 to a vertical surface, such as the utility pole 20. Additionally, the mounting arrangement 102 allows mounting of the cabinet assembly 2 to surfaces other than the utility pole 20. For example, the cabinet assembly 2 can be mounted to a wall or other vertical surface.

The linkages 104 each include a pair of bars 103 pivotally connected at a central point. The linkages 104 are also pivotally interconnected at hinge points 105 located at each end of the bars 103. As the linkages 104 pivot from the substantially horizontal orientation of FIG. 1 to a substantially vertical orientation (as shown in FIGS. 2A-2B and FIG. 3), the scissors lift 100 extends downwardly from a retracted position to an extended position.

FIGS. 2A-2B show front and rear views, respectively, of the cabinet 10 of FIG. 1 with the scissors lift 100 in an extended position so as to move the cabinet to a lowered position on the utility pole 20. In the lowered position, a repairperson can open the doors 12 to access an interior 14 of the cabinet 10 while standing on the ground near the utility pole 20.

The drive mechanism 107 connects to the mounting arrangement 102 and the linkages 104, as shown below in FIGS. 6A-6B, to drive the scissors lift 100 between extended and retracted positions. Movement of the scissors lift 100 between extended and retracted positions causes movement of the cabinet 10 between lowered and raised positions, respectively. In the embodiment shown, the drive mechanism 107 includes a screw drive 106 rotatably mounted in a downward orientation from a support bar 113, and drives vertical movement of the cabinet by causing the linkages 104 to pivot.

Figure 3:
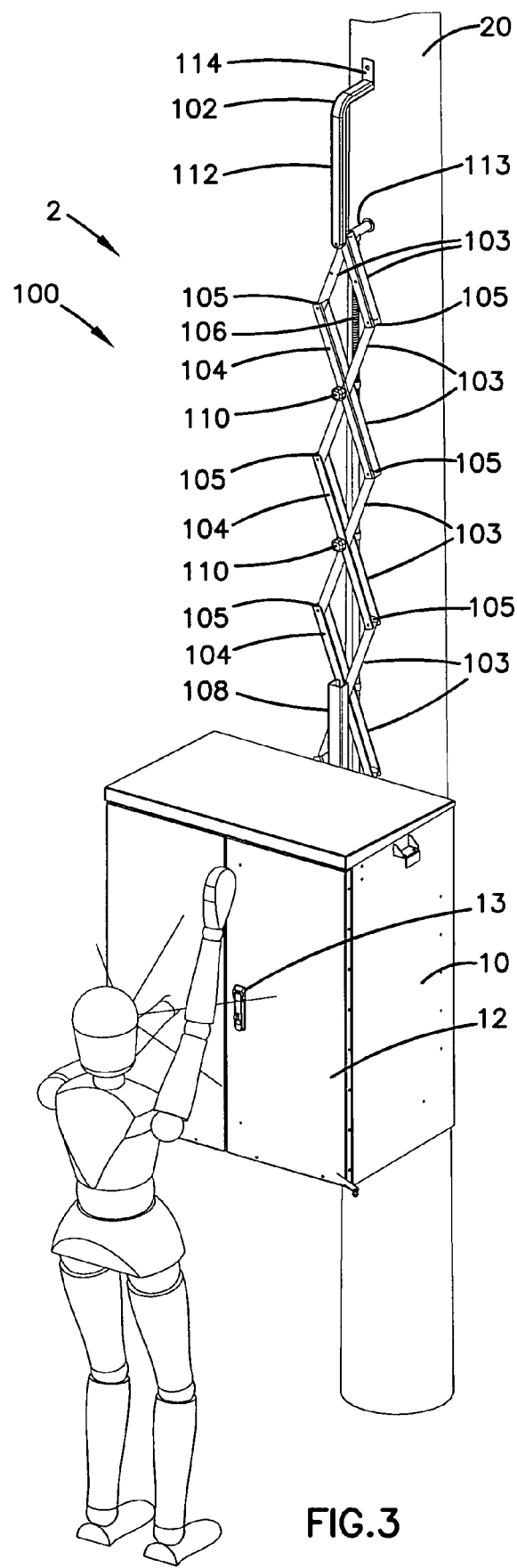
FIG. 3 is a schematic perspective front view of the cabinet assembly of FIG. 1 in a lowered position and mounted to a utility pole.

FIG. 3 shows the cabinet 10 of FIG. 1 in a closed position and with the scissors lift 100 extended to move the cabinet to a lowered position on the utility pole 20. A user of the cabinet assembly 2 can lower the cabinet 10 prior to opening the doors 12, allowing for ease of opening. The lowered cabinet eliminates a disadvantage of a stationary elevated cabinet, in that a repairperson or other user encountering a stationary elevated cabinet must use a ladder to reach the cabinet; however, the ladder must be leaned on the pole. Opening the cabinet doors 12 can therefore be awkward because the underside of the cabinet 10 forms an overhang above the ladder.

FIGS. 4A-4B illustrate the construction of the cabinet assembly 2. The cabinet assembly 2 includes the cabinet and the scissors lift 100. The scissors lift 100 is configured to affix the cabinet 10 to the utility pole 20. The scissors lift 100 includes the mounting arrangement 102, as well as linkages 104, a drive mechanism 107, a sleeve 108, and guide blocks 110. The mounting arrangement 102 affixes the scissors lift 100 to the pole 20, and includes fasteners 114 and support bars 112, 113. The fasteners 114 can be nails, bolts, screws, clamps, or other fastening equipment. In the embodiment shown, two fasteners are used. One fastener is a screw inserted into the utility pole 20, and a second fastener is a bolt passed through a hole drilled through the utility pole 20.

Two linkages 104 pivotally mount to the support bar 112. Subsequent linkages of the plurality of linkages 104 in turn connect to those linkages to form a lattice arrangement with pivotal interconnections at the ends and midpoints of each linkage, as previously described.

The sleeve 108 is vertically affixed to the cabinet 10 and slides along guide blocks 110 located at midpoints along each linkage 104. The sleeve 108 defines a slot 109 and an interior volume 111. The sleeve 108 is fixedly attached to a lowermost guide block 110 and allows the other guide blocks 110 and the support bar 112 to reside within the interior volume 111 by sliding along the slot 109. The sleeve 108 is longer than the distance between adjacent guide blocks 110 when the scissors lift 100 is in an extended position. Therefore, although in moving to the extended position some of the guide blocks 110 will exit the top of the slot 109, generally at least two guide blocks 110 are held within the sleeve 108 at any time, including the lowest guide block 110 which is affixed to the cabinet 10, preferably within the sleeve. The guide blocks 110 thereby coordinate with the sleeve 108 to maintain the vertical orientation of the cabinet 10 in both the raised and lowered positions.

Figure 5A:
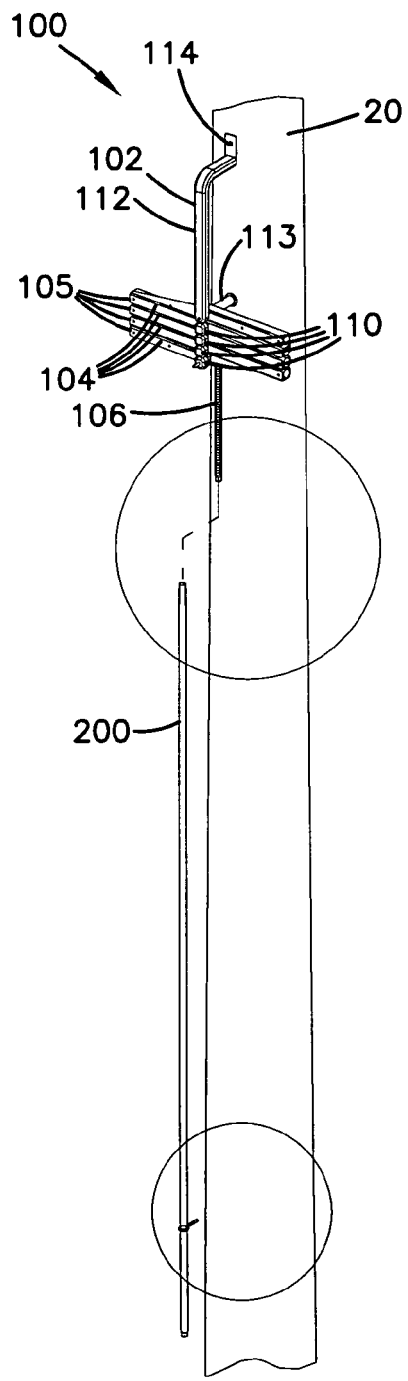
FIG. 5A is a perspective view of a portion of a utility pole having a scissors lift mounted thereon.
Figure 5B:
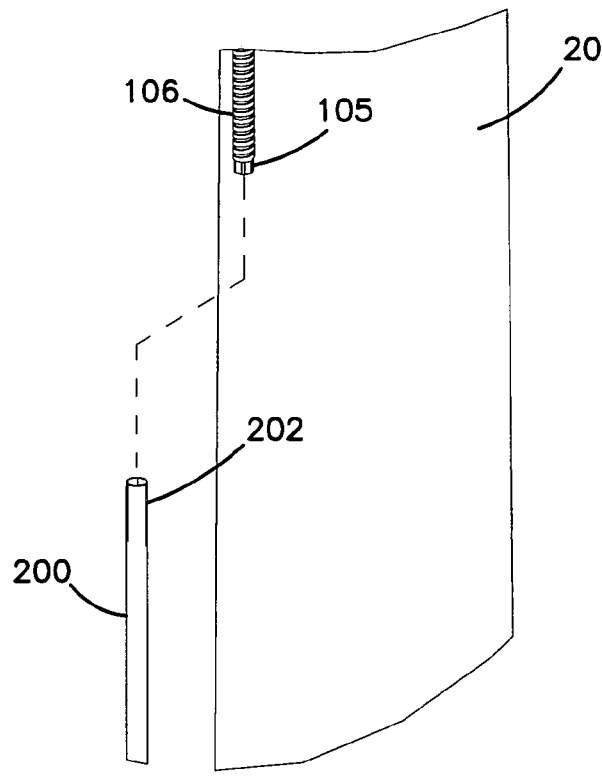
FIG. 5B is a perspective view of the interface between an extension drive rod and screw drive of FIG. 5A.

FIGS. 5A-5B show a possible mechanism for controlling the scissors lift 100 to control the height of the cabinet 10. A drive bar 200 includes a non-rotatable connection to the screw drive 106. In the embodiment shown, the drive bar 200 optionally has matching threading to the screw drive 106, and includes a complementary hexagonal configuration arranged to non-rotatably accept insertion of an end portion of the screw drive 106. When the screw drive 106 is inserted into the drive bar 200, the bar can be rotated by a repairperson or machine without requiring that the person or machine be located at an elevated height to reach the screw drive 106. Rotation of the drive bar 200 causes the screw drive 106 to turn, thereby driving the scissors lift 100 between retracted and extended positions based on the selected direction of rotation.

FIGS. 6A-6B show perspective and side views of the scissors lift 100. A plurality of support bands 116 are located at the midpoints of the linkages 104 on the opposite side from the guide blocks 110. The support bands 116 connect the linkages 104 to the screw drive 106. One of the support bands 116 has a threaded internal surface (not shown) complementary to the threaded screw drive 106, while the other support bands 116 slide along the screw drive 106. The threaded support band 116 is configured to interlock with the screw drive, and is vertically moveable by rotation of the screw drive 106. The remaining support bands 116 remain unthreaded, and have an internal circumference sufficient to slide along the screw drive 106 as the threaded band is raised or lowered by rotation of the screw drive. Rotation of the screw drive 106 in a first direction causes downward movement of the support bands 116, thereby extending the linkages 104 and lowering the cabinet 10. Rotation of the screw drive 106 in a second direction causes upward movement of the support bands 116, thereby contracting the linkages 104 and raising the cabinet 10.

The drive mechanism 107 includes a screw drive 106 and the support bands 116. The screw drive 106 is rotatably mounted to the support bar 113. A user rotates the screw drive 106, which in turn raises or lowers (depending on the rotational direction of the screw drive) the support bands 116 and causes the linkages 104 to pivot, thereby extending the scissors lift 100 downwardly.

In one embodiment, the length and number of linkages 104 are such that one or more of the support bands 116 can be lowered off of the screw drive 106 when the scissors lift 100 is in an extended position. In one embodiment, the threaded support band 116 screws onto the drive bar 200, shown in FIGS. 5A-5B. In other embodiments, such as an embodiment where only the uppermost support band 116 is threaded, the threaded support band remains on the screw drive 106. The support bands 116 that extend onto the drive bar 200 are drawn back onto the screw drive 106 as the threaded support band 116 is raised to the retracted position by the screw drive 106 and optionally by the drive bar 200.

Referring now to FIGS. 1-6 generally, the scissors lift 100 allows a repairperson or other individual requiring access to the cabinet 10 to extend the scissors lift 100 to lower the cabinet to a lowered position, open the cabinet, and perform any maintenance or repair operations required. When the repairperson has completed the maintenance or repair, they can retract the scissors lift 100 to raise the cabinet 10 to its raised position.

In certain embodiments, a cradle or holder can be added to support the cabinet 10 in the raised position. The cradle or other holder holds the cabinet 10 to the utility pole 20 so that the full weight of the cabinet 10 need not be continuously supported by the scissors lift 100.

The above specification, examples and data provide a complete description of the manufacture and use of the composition of the invention. Since many embodiments of the invention can be made without departing from the spirit and scope of the invention, the invention resides in the claims hereinafter appended.

The claimed invention is:

1. A cabinet assembly comprising:
    (a) a scissors lift mountable to a utility pole and moveable between extended and retracted positions, the scissors lift including:
        a plurality of linkages;
        a plurality of guide blocks located along the plurality of linkages;
        a sleeve fixedly attached to the cabinet and configured to slideably attach to one or more of the guide blocks; and
        a drive mechanism interfaced with the plurality of linkages and configured to move the scissors lift between the extended and retracted positions; and
    (b) a cabinet mounted to the scissors lift and moveable between raised and lowered positions.

2. The cabinet assembly of claim 1, wherein the raised position of the cabinet corresponds to a retracted position of the scissors lift and the lowered position of the cabinet corresponds to an extended position of the scissors lift.

3. The cabinet assembly of claim 1, wherein the drive mechanism includes a screw drive.

4. The cabinet assembly of claim 3, further comprising a drive bar non-rotatably attachable to the screw drive.

5. The cabinet assembly of claim 3, wherein the drive mechanism includes a plurality of support bands affixed to the plurality of linkages, wherein one of the support bands has a threaded interior surface configured to interlock with the screw drive.

6. The cabinet assembly of claim 1, wherein the cabinet is a fiber distribution hub.

7. A telecommunications cabinet assembly comprising:
    (a) a scissors lift capable of being fastened to a utility pole at a raised position and including a plurality of linkages, a plurality of guide blocks located along the plurality of linkages, a sleeve fixedly attached to the telecommunications cabinet and configured to slidably attach to one or more of the guide blocks, and a drive mechanism, the scissors lift oriented downwardly and moveable between extended and retracted positions;
    (b) a telecommunications cabinet mounted to the scissors lift and moveable between the raised position and a lowered position by extending the scissors lift from the retracted position to the extended position.

8. The telecommunications cabinet assembly of claim 7, wherein the drive mechanism includes a screw drive configured to move the screw drive between the extended and retracted positions.

9. The telecommunications cabinet assembly of claim 8, wherein the drive mechanism includes a plurality of support bands, and at least one of the plurality of support bands includes a threaded interior surface configured to interlock with the screw drive.

10. The telecommunications cabinet assembly of claim 7, wherein the cabinet is a fiber distribution hub.

11. The telecommunications cabinet assembly of claim 7, further comprising one or more fasteners fastening the scissors lift to the utility pole.

12. The telecommunications cabinet assembly of claim 7, wherein the raised position is approximately eight feet above the ground.

13. A method of accessing a telecommunications cabinet, the method comprising:
    extending a scissors lift to move a telecommunications cabinet from a raised position to a lowered position, the scissors lift including a plurality of linkages, a plurality of guide blocks located along the plurality of linkages, and a sleeve fixedly attached to the telecommunications cabinet and configured to slidably attach to one or more of the guide blocks;
    accessing the interior of the telecommunications cabinet;
    retracting the scissors lift to move the telecommunications cabinet from the lowered position to the raised position.

14. The method of claim 13, further comprising rotating a screw drive in a first direction to extend the scissors lift.

15. The method of claim 14, further comprising rotating a screw drive in a second direction opposite the first direction to retract the scissors lift.

16. The method of claim 13, further comprising non-rotatably affixing a control bar to the screw drive.

17. The method of claim 16, wherein rotation of the control bar results in rotation of the screw drive.

18. A scissors lift for a telecommunications cabinet, comprising:
(a) a mount mountable to a utility pole;
(b) a plurality of scissors linkages;
(c) a drive mechanism interfaced with the plurality of scissors linkages and configured to move the linkages between extended and retracted positions;
wherein the drive mechanism includes a screw drive engageable by a drive bar and a plurality of support bands affixed to the plurality of scissors linkages, wherein the screw drive is oriented parallel to a direction of extension of the scissors linkages and one of the support bands includes a threaded interior configured to interlock with the screw drive, the remaining support bands having an unthreaded interior and sized to extend onto the drive bar when the linkages are in the extended position.

* * * * *